(12) United States Patent
Heo et al.

(10) Patent No.: US 10,570,054 B2
(45) Date of Patent: Feb. 25, 2020

(54) COMPOSITION FOR FORMING SOLAR CELL ELECTRODE AND ELECTRODE PREPARED USING THE SAME

(71) Applicant: Samsung SDI Co., Ltd., Yongin-si, Gyeonggi-do (KR)

(72) Inventors: Ryun Min Heo, Suwon-si (KR); Young Kwon Koo, Suwon-si (KR); Sang Hoon Yoo, Suwon-si (KR); Jung Chul Lee, Suwon-si (KR); Ye Jin Kim, Suwon-si (KR); Chul Kyu Kim, Suwon-si (KR); Sung Eun Lee, Suwon-si (KR); Ji Seon Lee, Suwon-si (KR)

(73) Assignee: Samsung SDI Co., Ltd., Yongin-Si, Gyeonggi-do (KR)

(*) Notice: Subject to any disclaimer, the term of this patent is extended or adjusted under 35 U.S.C. 154(b) by 9 days.

(21) Appl. No.: 15/957,116

(22) Filed: Apr. 19, 2018

(65) Prior Publication Data

US 2019/0010081 A1    Jan. 10, 2019

(30) Foreign Application Priority Data

Jul. 6, 2017  (KR) .......................... 10-2017-0086148

(51) Int. Cl.
*H01B 1/08* (2006.01)
*C03C 8/18* (2006.01)
(Continued)

(52) U.S. Cl.
CPC ............ *C03C 8/18* (2013.01); *C03C 3/122* (2013.01); *C03C 3/14* (2013.01); *C03C 3/142* (2013.01);
(Continued)

(58) Field of Classification Search
CPC . C03C 2204/00; C03C 2205/00; C03C 3/122; C03C 3/14; C03C 3/142;
(Continued)

(56) References Cited

U.S. PATENT DOCUMENTS

| 2011/0095240 A1* | 4/2011 | Nakamura | .............. C03C 3/062 |
| | | | 252/514 |
| 2014/0239238 A1* | 8/2014 | Tsunoda | .................... C03C 8/04 |
| | | | 252/514 |

(Continued)

FOREIGN PATENT DOCUMENTS

| CN | 103827052 B | 8/2016 |
| CN | 106816484 A | 6/2017 |

(Continued)

OTHER PUBLICATIONS

Taiwanese Office Action dated Nov. 19, 2018 in the corresponding Taiwanese Patent Application No. 107114919.

(Continued)

*Primary Examiner* — Mark Kopec
*Assistant Examiner* — Jaison P Thomas
(74) *Attorney, Agent, or Firm* — Lee IP Law, PC (57) ABSTRACT

A composition for solar cell electrodes includes a conductive powder, a glass frit, and an organic vehicle. The glass frit contains about 20 mol % to about 40 mol % of an alkali metal, about 20 mol % to about 30 mol % of zinc (Zn), and about 7 mol % to about 20 mol % of magnesium (Mg) in terms of oxide content.

9 Claims, 5 Drawing Sheets

(51) Int. Cl.
  *C03C 8/16* (2006.01)
  *C03C 8/04* (2006.01)
  *C03C 8/10* (2006.01)
  *C03C 3/14* (2006.01)
  *C03C 3/12* (2006.01)
  *C03C 4/14* (2006.01)
  *H01L 31/0224* (2006.01)
  *H01L 31/18* (2006.01)
  *H01B 1/16* (2006.01)
  *H01L 31/068* (2012.01)
  *H01B 1/22* (2006.01)

(52) U.S. Cl.
  CPC .................. *C03C 4/14* (2013.01); *C03C 8/04* (2013.01); *C03C 8/10* (2013.01); *C03C 8/16* (2013.01); *H01B 1/08* (2013.01); *H01B 1/16* (2013.01); *H01B 1/22* (2013.01); *H01L 31/022425* (2013.01); *H01L 31/068* (2013.01); *H01L 31/1804* (2013.01); *C03C 2204/00* (2013.01); *C03C 2205/00* (2013.01)

(58) Field of Classification Search
  CPC .... C03C 4/14; C03C 8/04; C03C 8/10; C03C 8/16; C03C 8/18; H01L 31/022425; H01B 1/08
  See application file for complete search history.

(56) References Cited

U.S. PATENT DOCUMENTS

2017/0301804 A1* 10/2017 Hang .................. B23K 35/025
2018/0122967 A1*  5/2018 Jung ................. H01L 31/02243
2019/0031557 A1*  1/2019 Cela Greven ............ H01B 1/22

FOREIGN PATENT DOCUMENTS

JP    2012-084585 A    4/2012
JP    2015050349 A     3/2015
KR    20170064805 A    6/2017
TW    201635572 A      10/2016

OTHER PUBLICATIONS

Chinese Office Action dated Jul. 3, 2019.
Korean Office Action dated Jun. 18, 2019.

* cited by examiner

COMPOSITION FOR FORMING SOLAR CELL ELECTRODE AND ELECTRODE PREPARED USING THE SAME

CROSS-REFERENCE TO RELATED APPLICATION

Korean Patent Application No. 10-2017-0086148, filed on Jul. 6, 2017 in the Korean Intellectual Property Office, and entitled: "Composition for Forming Solar Cell Electrode and Electrode Prepared Using the Same," is incorporated by reference herein in its entirety.

BACKGROUND

1. Field

Embodiments relate to a composition for solar cell electrodes and an electrode fabricated using the same.

2. Description of Related Art

Solar cells generate electricity using the photovoltaic effect of a p-n junction which converts photons of sunlight into electricity. In a solar cell, front and rear electrodes are formed on upper and lower surfaces of a semiconductor wafer or substrate having a p-n junction, respectively. Then, the photovoltaic effect at the p-n junction is induced by sunlight entering the semiconductor wafer and electrons generated by the photovoltaic effect at the p-n junction provide electric current to the outside through the electrodes. The electrodes of the solar cell are formed on the wafer by applying, patterning, and baking an electrode composition.

SUMMARY

Embodiments are directed to a composition for solar cell electrodes including a conductive powder, a glass frit, and an organic vehicle. The glass frit contains about 20 mol % to about 40 mol % of an alkali metal, about 20 mol % to about 30 mol % of zinc (Zn), and about 7 mol % to about 20 mol % of magnesium (Mg) in terms of oxide content.

A molar ratio of the alkali metal to magnesium (Mg) may range from about 1:1 to about 6:1 in terms of oxide content.

The glass frit may further contain tellurium (Te) and may satisfy Equation 1:

$$\text{About } 0.4 \leq (M_{Zn}+M_{AL})/M_{Te} \leq \text{about } 4.0, \quad \text{[Equation 1]}$$

where $M_{Zn}$ denotes mol % of zinc (Zn), $M_{AL}$ denotes mol % of the alkali metal, and $M_{Te}$ denotes mol % of tellurium (Te), as measured in terms of oxide content.

The alkali metal may include at least one of lithium (Li), sodium (Na), and potassium (K).

The glass frit may include at least one of a lead (Pb)-tellurium (Te)-alkali metal-zinc (Zn)-magnesium (Mg)-oxygen (O) glass frit, a bismuth (Bi)-tellurium (Te)-alkali metal-zinc (Zn)-magnesium (Mg)-oxygen (O) glass frit, and a lead (Pb)-bismuth (Bi)-tellurium (Te)-alkali metal-zinc (Zn)-magnesium (Mg)-oxygen (O) glass frit.

The glass frit may further contain boron (B).

The composition for solar cell electrodes may include about 67.5 wt % to about 96.5 wt % of the conductive powder, about 0.1 wt % to about 20 wt % of the glass frit, and about 1 wt % to about 30 wt % of the organic vehicle.

The glass frit may be present in an amount of about 0.1 wt % to about 3.0 wt % in the composition for solar cell electrodes.

The composition for solar cell electrodes may further include at least one additive selected from a dispersant, a thixotropic agent, a plasticizer, a viscosity stabilizer, an anti-foaming agent, a pigment, a UV stabilizer, an antioxidant, and a coupling agent.

Embodiments are also directed to a solar cell electrode fabricated using the composition for solar cell electrodes.

BRIEF DESCRIPTION OF DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Herein, the content (mol %) of each elemental metal included in a glass frit may be measured by inductively coupled plasma-optical emission spectrometry (ICP-OES). For example, ICP-OES may include pre-treating a sample, preparing a standard solution, and calculating the content of each elemental metal in the sample by measuring and converting the concentration of an analysis target. In an operation of pre-treating a sample, a predetermined amount of the sample may be dissolved in an acid solution and then heated for carbonization. The acid solution may include, for example, a sulfuric acid ($H_2SO_4$) solution. The carbonized sample may be diluted with a solvent such as distilled water or hydrogen peroxide ($H_2O_2$) to an appropriate extent that allows analysis of the analysis target. In view of element detection capability of an ICP-OES tester, the carbonized sample may be diluted about 10,000 fold. In measurement with the ICP-OES tester, the pre-treated sample may be calibrated using a standard solution, for example, an analysis target standard solution for measuring elements. By way of example, calculation of the mole content of each element in the glass frit can be accomplished by introducing the standard solution into the ICP-OES tester and plotting a calibration curve using an external standard method, followed by measuring and converting the concentration (ppm) of each elemental metal in the pre-treated sample using the ICP-OES tester.

Composition for Solar Cell Electrodes

A composition for solar cell electrodes embodiments may include a conductive powder, a glass frit, and an organic vehicle, wherein the glass frit contains about 20 mol % to about 40 mol % of alkali metal, about 20 mol % to about 30 mol % of zinc (Zn), and about 7 mol % to about 20 mol % of magnesium (Mg) in terms of oxide content.

Now, each component of the composition for solar cell electrodes will be described in more detail.

Conductive Powder

The conductive powder serves to impart electrical conductivity to the composition for solar cell electrodes. The composition for solar cell electrodes may include a metal powder such as silver (Ag) powder or aluminum (Al) powder as the conductive powder. For example, the conductive powder may be silver powder. The conductive powder may have a nanometer or micrometer-scale particle size. For example, the conductive powder may be silver powder having a particle diameter of dozens to several hundred nanometers or having a particle diameter of several to dozens of micrometers. In some implementations, the conductive powder may be a mixture of two or more types of silver powder having different particle sizes.

The conductive powder may have various particle shapes such as a spherical, flake or amorphous particle shape, as examples.

The conductive powder may have an average particle diameter (D50) of about 0.1 μm to about 10 μm, or, for example, about 0.5 μm to about 5 μm. Within this range of average particle diameter, the composition may reduce contact resistance and line resistance of a solar cell. The average particle diameter may be measured using, for example, a Model 1064D particle size analyzer (CILAS Co., Ltd.) after dispersing the conductive powder in isopropyl alcohol (IPA) at 25° C. for 3 minutes via ultrasonication.

The conductive powder may be present in an amount of about 67.5 wt % to about 96.5 wt %, or, for example, about 75 wt % to about 95 wt % in the composition for solar cell electrodes. Within this range, the composition may improve conversion efficiency of a solar cell and may be easily prepared in paste form. For example, the conductive powder may be present in an amount of about 67.5 wt %, 68 wt %, 69 wt %, 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, 95 wt %, 96 wt %, or 96.5 wt % in the composition for solar cell electrodes.

Glass Frit

The glass frit may serve to form silver crystal grains in an emitter region by etching an anti-reflection layer and melting the conductive powder during a baking process of the composition for solar cell electrodes. Further, the glass frit may improve adhesion of the conductive powder to a wafer and may be softened to decrease the baking temperature during the baking process.

The glass frit may contain about 20 mol % to about 40 mol % of alkali metal, about 20 mol % to about 30 mol % of zinc (Zn), and about 7 mol % to about 20 mol % of magnesium (Mg) in terms of oxide content. When the glass frit contains alkali metal, zinc, and magnesium in amounts within these ranges, the glass frit may prevent spreading of the composition for solar cell electrodes during the baking process, thereby minimizing shadow loss. The glass frit may increase precipitation of the conductive powder in glass after the baking process, thereby improving resistance of a solar cell electrode. If the glass frit were to be free of any one of alkali metal, zinc and magnesium or if the amounts of alkali metal, zinc and magnesium were to be outside the aforementioned ranges, prevention of spreading of the composition may not be achieved. The glass frit may include the balance of a metal compound other than the alkali metal, zinc and magnesium.

The glass frit may contain the alkali metal in an amount of, for example, about 20 mol %, 21 mol %, 22 mol %, 23 mol %, 24 mol %, 25 mol %, 26 mol %, 27 mol %, 28 mol %, 29 mol %, 30 mol %, 31 mol %, 32 mol %, 33 mol %, 34 mol %, 35 mol %, 36 mol %, 37 mol %, 38 mol %, 39 mol %, or 40 mol % in terms of oxide content.

The glass frit may contain zinc (Zn) in an amount of, for example, about 20 mol %, 21 mol %, 22 mol %, 23 mol %, 24 mol %, 25 mol %, 26 mol %, 27 mol %, 28 mol %, 29 mol %, or 30 mol % in terms of oxide content.

The glass frit may contain magnesium (Mg) in an amount of, for example, about 7 mol %, 8 mol %, 9 mol %, 10 mol %, 11 mol %, 12 mol %, 13 mol %, 14 mol %, 15 mol %, 16 mol %, 17 mol %, 18 mol %, 19 mol %, or 20 mol % in terms of oxide content.

The alkali metal may include at least one of lithium (Li), sodium (Na), and potassium (K).

In the glass flit, a molar ratio of the alkali metal to the magnesium (Mg) may range from about 1:1 to about 6:1 in terms of oxide content. Within this range, the glass flit may provide good balance between electrical properties of a solar cell while improving fill factor and conversion efficiency of the solar cell.

The glass frit may further contain tellurium (Te) and satisfy Equation 1:

About $0.4 \leq (M_{Zn}+M_{AL})/M_{Te} \leq $ about $4.0$     [Equation 1]

In Equation 1, $M_{Zn}$ denotes mol % of zinc (Zn), $M_{AL}$ denotes mol % of alkali metal, and $M_{Te}$ denotes mol % of tellurium (Te), as measured in terms of oxide content.

For example, $(M_{Zn}+M_{AL})/M_{Te}$ may range from about 1 to about 2. Within this range, the glass frit may improve electrical properties, fill factor, and conversion efficiency of a solar cell.

The glass frit may contain tellurium (Te) in an amount of about 10 mol % to about 53 mol %, or, for example, about 20 mol % to about 50 mol %, or, for example, about 25 mol % to about 45 mol % in terms of oxide content. Within this range, the glass frit may improve electrical properties of a solar cell. The glass frit may contain tellurium (Te) in an amount of, for example, about 10 mol %, 11 mol %, 12 mol %, 13 mol %, 14 mol %, 15 mol %, 16 mol %, 17 mol %, 18 mol %, 19 mol %, 20 mol %, 21 mol %, 22 mol %, 23 mol %, 24 mol %, 25 mol %, 26 mol %, 27 mol %, 28 mol %, 29 mol %, 30 mol %, 31 mol %, 32 mol %, 33 mol %, 34 mol %, 35 mol %, 36 mol %, 37 mol %, 38 mol %, 39 mol %, 40 mol %, 41 mol %, 42 mol %, 43 mol %, 44 mol %, 45 mol %, 46 mol %, 47 mol %, 48 mol %, 49 mol %, 50 mol %, 51 mol %, 52 mol %, or 53 mol % in terms of oxide content.

The glass frit may be at least one of a lead (Pb)-tellurium (Te)-alkali metal-zinc (Zn)-magnesium (Mg)-oxygen (O) glass frit, a bismuth (Bi)-tellurium (Te)-alkali metal-zinc (Zn)-magnesium (Mg)-oxygen (O) glass flit, and a lead (Pb)-bismuth (Bi)-tellurium (Te)-alkali metal-zinc (Zn)-magnesium (Mg)-oxygen (O) glass frit.

The glass frit may further contain boron (B). When the glass frit further contains boron (B), the glass frit may contain boron (B) in an amount of about 0 mol % to about 10 mol %, or, for example, about 0.5 mol % to about 7 mol % in terms of oxide content. Within this range, the glass frit may improve electrical properties of a solar cell. The glass frit may include boron (B) in an amount of, for example, about 0 mol %, 0.5 mol %, 1 mol %, 2 mol %, 3 mol %, 4 mol %, 5 mol %, 6 mol %, 7 mol %, 8 mol %, 9 mol %, or 10 mol % in terms of oxide content.

The glass frit may be a lead-free glass frit, for example, having no added lead. For example, the glass frit may be "lead free" to the extent specified by an industry standard restricting lead content, such a standard reflecting the EU RoHS Directive.

The glass frit may be prepared by a suitable method. For example, the glass frit may be prepared by mixing the aforementioned components using a ball mill or a planetary mill, melting the mixture at about 900° C. to about 1300° C., and quenching the melted mixture to 25° C., followed by pulverizing the obtained product using a disk mill, a planetary mill or the like.

The glass frit may be present in an amount of about 0.1 wt % to about 20 wt %, or, for example, about 0.1 wt % to about 10 wt %, or, for example, about 0.1 wt % to about 2.8 wt %, or, for example, about 0.1 wt % to about 2.0 wt % in the composition for solar cell electrodes. The glass frit may be present in an amount of, for example, about 0.1 wt %, 0.5 wt %, 1 wt %, 1.5 wt %, 2 wt %, 2.5 wt %, 3 wt %, 3.5 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16, wt % 17 wt %, 18 wt %, 19 wt %, or 20 wt % in the composition for solar cell electrodes.

The composition for solar cell electrodes including the glass frit containing alkali metal, zinc and magnesium in the above-described amounts may improve electrical properties of a solar cell electrode even when a relatively small amount of the glass frit is used. Thus, the composition for solar cell electrodes may prevent over-etching during baking of the composition, thereby ultimately improving conversion efficiency of a solar cell.

Organic Vehicle

The organic vehicle may impart suitable viscosity and rheological characteristics for printing to the composition for solar cell electrodes through mechanical mixing with inorganic components of the composition.

The organic vehicle may be a suitable organic vehicle for use in a composition for solar cell electrodes. The organic vehicle may include a binder resin, a solvent, or the like.

The binder resin may be selected from acrylate resins or cellulose resins. For example, ethyl cellulose may be used as the binder resin. In other implementations, the binder resin may be selected from among ethyl hydroxyethyl cellulose, nitrocellulose, blends of ethyl cellulose and phenol resins, alkyd resins, phenol resins, acrylate ester resins, xylene resins, polybutane resins, polyester resins, urea resins, melamine resins, vinyl acetate resins, wood rosin, polymethacrylates of alcohols, or the like.

The solvent may be, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, or ethyl lactate. These may be used alone or as a mixture thereof.

The organic vehicle may be present in an amount of about 1 wt % to about 30 wt % in the composition for solar cell electrodes. Within this range, the organic vehicle may provide sufficient adhesive strength and good printability to the composition. The organic vehicle may be present in an amount of, for example, about 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt % in the composition for solar cell electrodes.

Additives

The composition for solar cell electrodes may further include a suitable additive to enhance fluidity, process properties and stability, as desired. The additive may include a dispersant, a thixotropic agent, a plasticizer, a viscosity stabilizer, an anti-foaming agent, a pigment, a UV stabilizer, an antioxidant, a coupling agent, or the like. These may be used alone or as mixtures thereof. The additive may be present in an amount of about 0.1 wt % to about 5 wt % based on the total weight of the composition for solar cell electrodes. The amount of the additive may be changed, as desired. The additive may be present in an amount of, for example, about 0.1 wt %, 0.2 wt %, 0.3 wt %, 0.4 wt %, 0.5 wt %, 0.6 wt %, 0.7 wt %, 0.8 wt %, 0.9 wt %, 1 wt %, 1.5 wt %, 2 wt %, 2.5 wt %, 3 wt %, 3.5 wt %, 4 wt %, 4.5 wt %, or 5 wt % based on the total weight of the composition for solar cell electrodes.

Solar Cell Electrode and Solar Cell Including the Same

Figure 1:
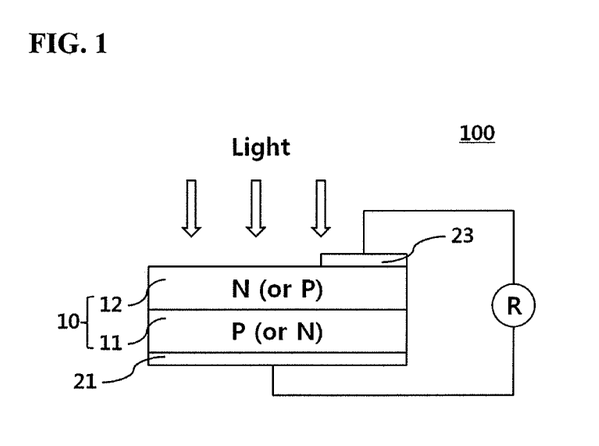
FIG. 1 illustrates a schematic view of a solar cell according to an embodiment.
Figure 2:
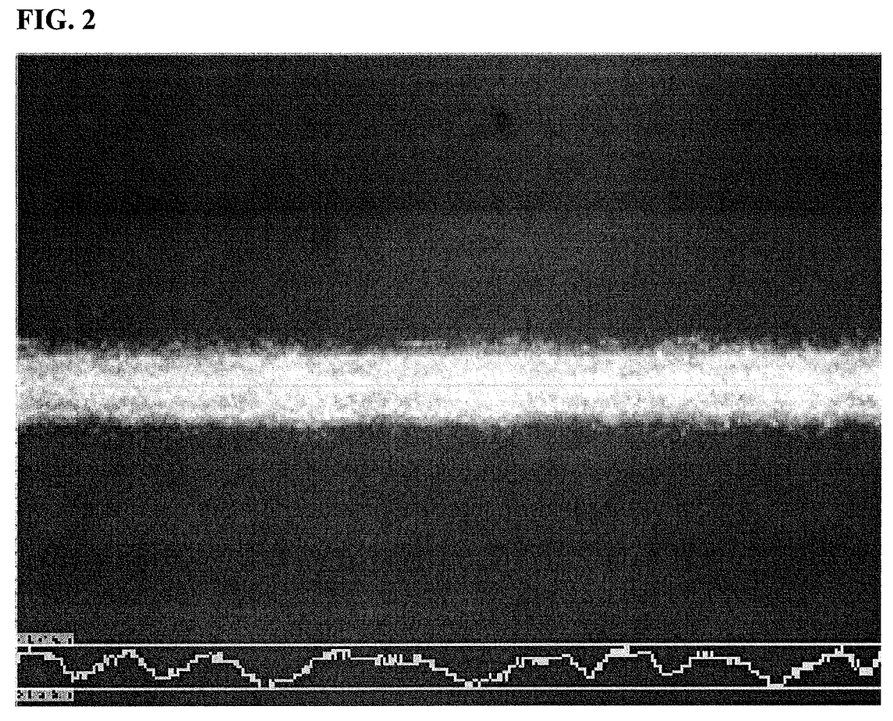
FIG. 2 illustrates a surface image of a front finger electrode for a solar cell fabricated in Example 1.
Figure 3:
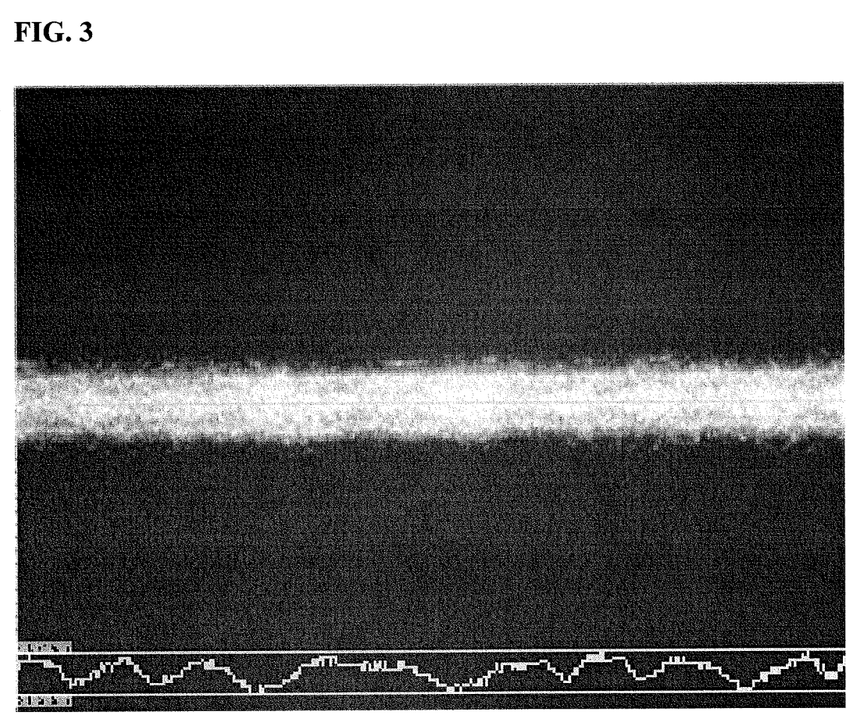
FIG. 3 illustrates a surface image of a front finger electrode for a solar cell fabricated in Example 3.
Figure 4:
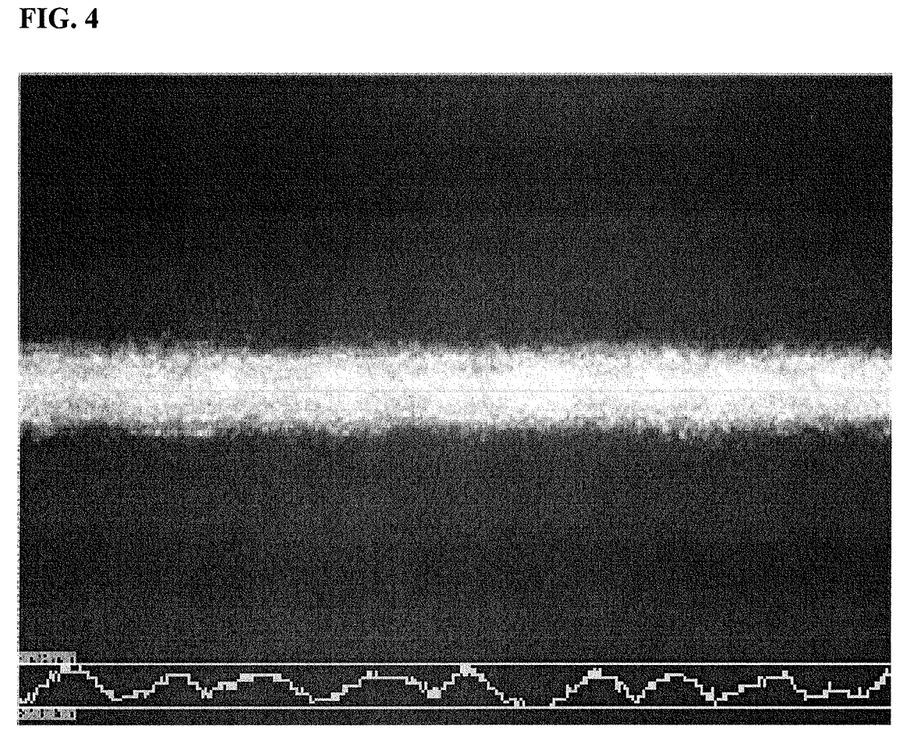
FIG. 4 illustrates a surface image of a front finger electrode for a solar cell fabricated in Example 7.

Embodiments further relate to an electrode formed of the composition for solar cell electrodes and a solar cell including the same. FIG. 1 illustrates a solar cell in accordance with an embodiment.

Referring to FIG. 1, a solar cell 100 according to this embodiment may include a substrate 10, a front electrode 23 formed on a front surface of the substrate 10, and a rear electrode 21 formed on a back surface of the substrate 10.

The substrate 10 may be a substrate with a p-n junction formed thereon. For example, the substrate 10 may include a semiconductor substrate 11 and an emitter 12. The substrate 10 may be, for example, a substrate prepared by doping one surface of a p-type semiconductor substrate 11 with an n-type dopant to form an n-type emitter 12. In some implementations, the substrate 10 may be a substrate prepared by doping one surface of an n-type semiconductor substrate 11 with a p-type dopant to form a p-type emitter 12. The semiconductor substrate 11 may be either a p-type substrate or an n-type substrate. The p-type substrate may be a semiconductor substrate 11 doped with a p-type dopant, and the n-type substrate may be a semiconductor substrate 11 doped with an n-type dopant.

In descriptions of the substrate 10, the semiconductor substrate 11, and the like, a surface of such a substrate through which light enters the substrate is referred to as a front surface (light receiving surface), and a surface of the substrate opposite the front surface is referred to as a back surface.

The semiconductor substrate 11 may be formed of crystalline silicon or a compound semiconductor. The crystalline silicon may be monocrystalline or polycrystalline. For example, as the crystalline silicon, a silicon wafer may be used.

The p-type dopant may be a material that includes a group III element such as boron, aluminum, or gallium. The n-type dopant may be a material including a group V element, such as phosphorus, arsenic or antimony.

The front electrode 23 and/or the rear electrode 21 may be fabricated using the composition for solar cell electrodes. For example, the front electrode 23 may be fabricated using the composition including silver powder as the conductive powder, and the rear electrode 21 may be fabricated using the composition including aluminum powder as the conductive powder. The front electrode 23 may be formed by printing the composition for solar cell electrodes onto the emitter 12, followed by baking. The rear electrode 21 may be formed by applying the composition for solar cell electrodes to the back surface of the semiconductor substrate 11, followed by baking.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE 1

As an organic binder, 2.0 wt % of ethylcellulose (STD4, Dow Chemical Company) was sufficiently dissolved in 6.75 wt % of terpineol (Nippon Terpene Chemicals Inc.) at 60° C., and then 90.0 wt % of spherical silver powder (AG-4-8, Dowa Hightech Co., Ltd.) having an average particle diameter of 2.0 μm and 1.25 wt % of a glass frit having an average particle diameter of 1.0 μm and containing metal oxides in amounts as listed in Table 1 were added to the binder solution, followed by mixing and kneading in a 3-roll kneader, thereby preparing a composition for solar cell electrodes.

EXAMPLES 2 TO 11 AND COMPARATIVE EXAMPLES 1 TO 10

A composition for solar cell electrodes was prepared in the same manner as in Example 1 except that the composition of the glass frit was changed as listed in Table 1.

TABLE 1

| Mol % | $B_2O_3$ | $TeO_2$ | $Bi_2O_3$ | ZnO | $Li_2O$ | MgO | PbO |
|---|---|---|---|---|---|---|---|
| Example 1 | 5 | 38 | 5 | 20 | 24 | 8 | — |
| Example 2 | 2 | 39 | 2 | 20 | 23 | 14 | — |
| Example 3 | 4 | 38 | 3 | 20 | 20 | 15 | — |
| Example 4 | 2 | 36 | 3 | 30 | 22 | 7 | — |
| Example 5 | 3 | 39 | 1 | 22 | 28 | 7 | — |
| Example 6 | 3 | 40 | 1 | 22 | 27 | 7 | — |
| Example 7 | 3 | 37 | 1 | 22 | 30 | 7 | — |
| Example 8 | 2 | 29 | 1 | 20 | 40 | 8 | — |
| Example 9 | 3 | 28 | 2 | 24 | 23 | 20 | — |
| Example 10 | — | 37 | 2 | 28 | 23 | 10 | — |
| Example 11 | 2 | 28 | 2 | 25 | 28 | 13 | 2 |
| Comparative Example 1 | — | 68 | 5 | 13 | 14 | — | — |
| Comparative Example 2 | — | 66 | 5 | 9 | 15 | 5 | — |
| Comparative Example 3 | — | 57 | 2 | 13 | 18 | 10 | — |
| Comparative Example 4 | — | 48 | 4 | 22 | 11 | 15 | — |
| Comparative Example 5 | 1 | 34 | 3 | 17 | 30 | 15 | — |
| Comparative Example 6 | 2 | 28 | 2 | 33 | 25 | 10 | — |
| Comparative Example 7 | 4 | 35 | 4 | 27 | 17 | 13 | — |
| Comparative Example 8 | 2 | 18 | 2 | 25 | 43 | 10 | — |
| Comparative Example 9 | 2 | 36 | 2 | 25 | 30 | 5 | — |
| Comparative Example 10 | 2 | 18 | 2 | 25 | 30 | 23 | — |

Property Evaluation (1) Short Circuit Current (Isc, Unit: A), Open-Circuit Voltage (Voc, Unit: mV), and Serial Resistance (Rs, Unit: mΩ):

Each composition for solar cell electrodes prepared in Examples and Comparative Examples was deposited onto a front surface of a wafer by screen printing in a predetermined pattern, followed by drying in an IR drying furnace. A cell formed according to this procedure was subjected to baking at 600° C. to 900° C. for 60 to 210 seconds in a belt-type baking furnace, and then evaluated as to short circuit current (Isc), open-circuit voltage (Voc), and serial resistance (Rs) using a TLM (Transfer Length Method) tester. Results are shown in Table 2.

(2) Fill Factor (%) and Efficiency (%):

Each composition for solar cell electrodes prepared in Examples and Comparative Examples was deposited onto a front surface of a wafer by screen printing in a predetermined pattern, followed by drying in an IR drying furnace. Then, an aluminum paste was printed onto a back surface of the wafer and dried in the same manner as above. A cell formed according to this procedure was subjected to baking at 400° C. to 900° C. for 30 to 180 seconds in a belt-type baking furnace, and then evaluated as to fill factor (FF, %) and conversion efficiency (Eff. %) using a solar cell efficiency tester CT-801 (Pasan Co., Ltd.). Results are shown in Table 2.

Figure 5:
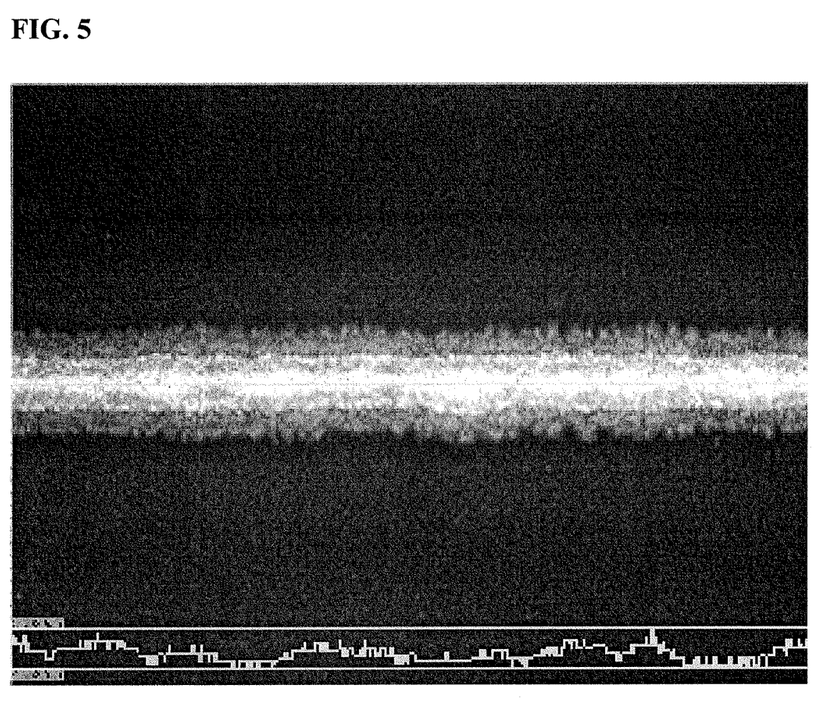
FIG. 5 illustrates a surface image of a front finger electrode for a solar cell fabricated in Comparative Example 1.

FIGS. 2 to 5 show images of finger electrodes fabricated by baking the compositions for solar cell electrodes of Example 1 (FIG. 2), Example 3 (FIG. 3), Example 7 (FIG. 4), and Comparative Example 1 (FIG. 5).

TABLE 2

| | Short circuit current (A) | Open-circuit voltage (mV) | Serial resistance (mΩ) | FF (%) | Eff. (%) |
|---|---|---|---|---|---|
| Example 1 | 9.230 | 0.63994 | 2.84 | 79.2 | 19.21 |
| Example 2 | 9.251 | 0.63966 | 2.83 | 79.3 | 19.27 |
| Example 3 | 9.254 | 0.63963 | 2.82 | 79.2 | 19.25 |
| Example 4 | 9.234 | 0.63720 | 2.76 | 79.3 | 19.16 |
| Example 5 | 9.239 | 0.63979 | 2.91 | 79.1 | 19.20 |
| Example 6 | 9.257 | 0.63898 | 2.76 | 79.2 | 19.24 |
| Example 7 | 9.286 | 0.63791 | 2.58 | 79.5 | 19.34 |
| Example 8 | 9.234 | 0.63822 | 2.97 | 79.3 | 19.19 |
| Example 9 | 9.235 | 0.63795 | 2.63 | 79.4 | 19.21 |
| Example 10 | 9.234 | 0.638 | 3.00 | 79.0 | 19.10 |
| Comparative Example 1 | 9.256 | 0.63253 | 3.62 | 77.4 | 18.61 |
| Comparative Example 2 | 9.232 | 0.63514 | 2.78 | 79.2 | 19.07 |
| Comparative Example 3 | 9.220 | 0.63319 | 3.22 | 78.7 | 18.87 |
| Comparative Example 4 | 9.235 | 0.63686 | 3.08 | 78.9 | 19.06 |
| Comparative Example 5 | 9.244 | 0.63706 | 3.00 | 78.9 | 19.08 |
| Comparative Example 6 | 9.211 | 0.63726 | 2.97 | 79.2 | 19.09 |
| Comparative Example 7 | 9.230 | 0.63877 | 2.99 | 79.1 | 19.15 |
| Comparative Example 8 | 9.235 | 0.63776 | 2.96 | 79.3 | 19.18 |
| Comparative | 9.254 | 0.6379 | 2.84 | 78.9 | 19.13 |

TABLE 2-continued

| | Short circuit current (A) | Open-circuit voltage (mV) | Serial resistance (mΩ) | FF (%) | Eff. (%) |
|---|---|---|---|---|---|
| Example 9 Comparative Example 10 | 9.168 | 0.63957 | 2.80 | 79.3 | 19.09 |

As shown in FIGS. 2 to 5, it can be seen that Examples 1, 3 and 7 were superior in the effect of preventing spread of the composition for solar cell electrodes during the baking process as compared with Comparative Example 1.

As shown in Table 2, it can be seen that the solar cell electrodes fabricated using the composition for solar cell electrodes in which the contents of alkali metal, zinc and magnesium fell within the ranges set forth herein exhibited good electrical properties, fill factor, and conversion efficiency.

Conversely, the solar cell electrodes of Comparative Examples 1 to 4, which were free from the glass frit, exhibited poor properties as a whole, as compared with those of Examples. Particularly, the solar cell electrodes of Comparative Examples 5 and 6 in which the content of zinc was outside the range set forth herein exhibited high serial resistance; the solar cell electrodes of Comparative Examples 7 and 8 in which the content of lithium was outside the range set forth herein exhibited low short circuit current; and the solar cell electrodes of Comparative Examples 9 and 10 in which the content of magnesium was outside the range set forth herein exhibited low short circuit current or high serial resistance and thus poor conversion efficiency.

By way of summation and review, as an electrode composition, a conductive paste composition including a conductive powder, a glass frit, and an organic vehicle may be used. The glass frit may serve to melt an anti-reflection film on a semiconductor wafer, thereby establishing electrical contact between the conductive powder and the wafer. However, during baking of a general electrode composition, shadow loss is likely to occur due to precipitation of the conductive powder at an edge of an electrode, and the anti-reflection film is likely to be over-etched, causing a reduction in serial resistance (Rs), open-circuit voltage (Voc), and a short circuit current (Isc) of the electrode.

Therefore, a composition for solar cell electrodes that can minimize shadow loss and recombination loss, thereby improving electrical characteristics of a solar cell electrode, is desirable.

Embodiments provide a composition for solar cell electrodes that can minimize shadow loss during baking of the composition, thereby improving resistance of a solar cell electrode, and an electrode fabricated using the same.

Embodiments provide a composition for solar cell electrodes that can prevent over-etching during baking of the composition, thereby improving electrical properties of a solar cell electrode, and an electrode fabricated using the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A composition for solar cell electrodes, comprising:
   a conductive powder;
   a glass frit; and
   an organic vehicle,
   wherein the glass frit contains about 20 mol % to about 40 mol % of an alkali metal, about 20 mol % to about 30 mol % of zinc (Zn), and about 7 mol % to about 20 mol % of magnesium (Mg) in terms of oxide content, and
   wherein the glass frit further contains tellurium and satisfies Equation 1:

$$0.4 \leq (M_{Zn} + M_{AL})/M_{Te} \leq 4.0 \quad \text{[Equation 1]}$$

where $M_{zn}$ denotes mol % of zinc, $M_{AL}$ denotes mol % of the alkali metal, and $M_{Te}$ denotes mol % of tellurium, as measured in terms of oxide content.

2. The composition according as claimed in claim 1, wherein a molar ratio of the alkali metal to magnesium (Mg) ranges from about 1:1 to about 6:1 in terms of oxide content.

3. The composition according as claimed in claim 1, wherein the alkali metal includes at least one of lithium (Li), sodium (Na), and potassium (K).

4. The composition according as claimed in claim 1, wherein the glass frit includes at least one of a lead (Pb)-tellurium (Te)-alkali metal-zinc (Zn)-magnesium (Mg)-oxygen (O) glass frit, a bismuth (Bi)-tellurium (Te)-alkali metal-zinc (Zn)-magnesium (Mg)-oxygen (O) glass frit, and a lead (Pb)-bismuth (Bi)-tellurium (Te)-alkali metal-zinc (Zn)-magnesium (Mg)-oxygen (O) glass frit.

5. The composition according as claimed in claim 1, wherein the glass frit further contains boron (B).

6. The composition according as claimed in claim 1, comprising:
   about 67.5 wt % to about 96.5 wt % of the conductive powder;
   about 0.1 wt % to about 20 wt % of the glass frit; and
   about 1 wt % to about 30 wt % of the organic vehicle.

7. The composition according as claimed in claim 6, wherein the glass frit is present in an amount of about 0.1 wt % to about 3.0 wt % in the composition for solar cell electrodes.

8. The composition according as claimed in claim 1, further comprising: at least one additive selected from a dispersant, a thixotropic agent, a plasticizer, a viscosity stabilizer, an anti-foaming agent, a pigment, a UV stabilizer, an antioxidant, and a coupling agent.

9. A solar cell electrode fabricated using the composition for solar cell electrodes according to claim 1.

* * * * *